(12) United States Patent
Itani et al.

(10) Patent No.: US 9,089,048 B2
(45) Date of Patent: Jul. 21, 2015

(54) MAGNETIC SHIELDING DEVICE AND WIRE HARNESS

(71) Applicants: AUTONETWORKS TECHNOLOGIES, LTD., Yokkaichi, Mie (JP); SUMITOMO WIRING SYSTEMS, LTD., Yokkaichi, Mie (JP); SUMITOMO ELECTRIC INDUSTRIES, LTD., Osaka-shi, Osaka (JP)

(72) Inventors: Yasushi Itani, Yokkaichi (JP); Fujio Sonoda, Yokkaichi (JP); Naoki Aoyama, Yokkaichi (JP); Yuichi Kimoto, Yokkaichi (JP); Masanori Kuwahara, Yokkaichi (JP); Yoshinori Sugimoto, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/374,020

(22) PCT Filed: Dec. 19, 2012

(86) PCT No.: PCT/JP2012/082923
§ 371 (c)(1),
(2) Date: Jul. 23, 2014

(87) PCT Pub. No.: WO2013/111480
PCT Pub. Date: Aug. 1, 2013

(65) Prior Publication Data
US 2014/0360771 A1    Dec. 11, 2014

(30) Foreign Application Priority Data

Jan. 23, 2012    (JP) .................................. 2012-010866

(51) Int. Cl.
*H05K 9/00* (2006.01)
*H02G 3/04* (2006.01)
*H02G 3/06* (2006.01)

(52) U.S. Cl.
CPC ........... *H05K 9/0086* (2013.01); *H02G 3/0481* (2013.01); *H02G 3/0487* (2013.01); *H05K 9/0098* (2013.01); *H02G 3/0666* (2013.01); *H02G 3/0683* (2013.01)

(58) Field of Classification Search
CPC . H05K 9/0086; H05K 9/0098; H02G 3/0481; H02G 3/0487; H02G 3/0666; H02G 3/0683
USPC .......... 174/32, 33, 34, 350, 360, 72 A, 102 R, 174/102 SP, 102 D
See application file for complete search history.

(56) References Cited

U.S. PATENT DOCUMENTS

| 2009/0130903 | A1* | 5/2009 | Tsukashima et al. ..... 439/607.23 |
| 2010/0038011 | A1* | 2/2010 | Yoshinaga ....................... 156/85 |
| 2010/0212952 | A1* | 8/2010 | Abdelmoula et al. ......... 174/390 |
| 2013/0105215 | A1* | 5/2013 | Morris et al. .................. 174/394 |

FOREIGN PATENT DOCUMENTS

| JP | A-10-173385 | 6/1998 |
| JP | A-2002-271082 | 9/2002 |
| JP | A-2006-344398 | 12/2006 |
| JP | A-2009-140988 | 6/2009 |
| JP | 2010140875 A * | 6/2010 |
| JP | A-2010-140875 | 6/2010 |

OTHER PUBLICATIONS

Feb. 12, 2013 International Search Report issued in International Patent Application No. PCT/JP2012/082923 (with English translation).
Feb. 12, 2013 International Preliminary Report on Patentability issued in International Patent Application No. PCT/JP2012/082923.

* cited by examiner

*Primary Examiner* — Hoa C Nguyen
*Assistant Examiner* — Amol Patel
(74) *Attorney, Agent, or Firm* — Oliff PLC

(57) ABSTRACT

An electromagnetic shielding device includes a conductive sheet that is a sheet-shaped flexible conductive member that can be deformed into a tube shape, and an outer edge portion coupling member that keeps the conductive sheet in a tube shape in a state in which a first outer edge portion and a second outer edge portion of the conductive sheet are joined together, the second outer edge portion being located on the side opposite to the first outer edge portion. For example, a parallel slit group is formed in the conductive sheet, the parallel slit group being constituted by a plurality of slits that extend in a direction that crosses a first direction from the first outer edge portion toward the second outer edge portion and that are lined up in the first direction.

14 Claims, 10 Drawing Sheets

MAGNETIC SHIELDING DEVICE AND WIRE HARNESS

This application is the national phase of PCT International Application No. PCT/JP2012/082923 that has an International filing date of Dec. 19, 2012 and designated the United States of America and claims priority to Japanese Patent App. No. JP 2012-010866 that was filed on Jan. 23, 2012. The disclosure of the prior applications is hereby incorporated by reference herein in their entirety.

BACKGROUND

As disclosed in JP 2006-344398A, a tube-shaped braided wire is often used as a shielding device that is deformable in accordance with the path of an electrical wire. According to P JP 2006-344398A, when an electrical wire is routed into a metal casing through an opening in the casing, one end of the tube-shaped braided wire is placed over a frame portion of the opening in the metal casing and then fixed to the frame portion of the opening in the casing with a crimp ring.

It should be noted that there are also cases where the frame portion of the electrical wire introduction opening in the metal casing is provided as an independent member. In these cases, the frame portion is fixed to the opening portion of the casing with a screw or the like. Such an independent member is generally called a shield shell.

Moreover, there are also cases where the shielding device is fixed to an end portion of an electrical wire protecting pipe that is a tube-shaped metal member through which the electrical wire passes. In the following description, a ring-shaped metal member to which the shielding device is fixed, such as the frame portion (including the shield shell) of the electrical wire introduction opening in the metal casing, the end portion of the electrical wire protecting pipe, or the like, will be referred to as a shield frame portion or a support.

Patent Document 1: JP 2006-344398A

SUMMARY

Technical Problem

Incidentally, the braided wire is tube-shaped. The electrical wire needs to be inserted into the braided wire before a connector is attached to its terminal. This operation is generally referred to as pre-insertion. The need for this pre-insertion of the electrical wire limits the degree of freedom in wire harness manufacturing and the wiring procedure.

Providing the braided wire on the electrical wire after the connector is attached to the terminal of the electrical wire, that is to say, enabling post-provision the braided wire would require the use of a large braided wire. In this case, it would be necessary to use a needlessly large braided wire that allows the insertion of a connector or the like having a larger external shape than the electrical wire. This would lead to an increase in the layout space, weight, and manufacturing cost of the wire harness, and is unrealistic.

Moreover, in the operation of placing the tube-shaped braided wire with the electrical wire pre-inserted therein over the shield frame portion, it is necessary to shift the position of the braided wire in the axial direction of the electrical wire. If the two ends of the braided wire are placed over respective shield frame portions of two casings that are arranged relatively close to each other, there is little leeway in the space for shifting the position of the braided wire. Therefore, the operation of placing the braided wire over the shield frame portion is difficult.

In view of the above, currently, it is required to enable post-provision of a shielding device on an electrical wire and a casing while also avoiding an increase in the size of the shielding device, in order to increase the workability and the degree of freedom in the procedure of the operation of attaching the shielding device.

It is an object herein to make it possible to perform post-provision of a shielding device on an electrical wire and a support without increasing the layout space, weight, and manufacturing cost of a wire harness.

Solution to Problem

An electromagnetic shielding device according to a first aspect includes a conductive sheet and a tube-shape holding member. The conductive sheet is a sheet-shaped flexible conductive member that can be deformed into a tube shape. The tube-shape holding member is a holding member that keeps the conductive sheet in a tube shape in a state in which a first outer edge portion and a second outer edge portion of four outer edge portions of the conductive sheet are joined together, the second outer edge portion being located on a side opposite to the first outer edge portion.

An electromagnetic shielding device according to a second aspect is one aspect of the electromagnetic shielding device according to the first aspect. In the conductive sheet of the electromagnetic shielding device according to the second aspect, a parallel slit group is formed, the parallel slit group being constituted by a plurality of slits that extend in a direction that crosses a first direction from the first outer edge portion toward the second outer edge portion and that are lined up in the first direction.

An electromagnetic shielding device according to a third aspect is one aspect of the electromagnetic shielding device according to the second aspect. In the conductive sheet of the electromagnetic shielding device according to the third aspect, a plurality of the parallel slit groups are formed side by side. The plurality of parallel slit groups are formed such that the parallel slit groups are arranged side by side in a second direction from a third outer edge portion toward a fourth outer edge portion on a side opposite to the third outer edge portion, the third and fourth outer edge portions being edge portions other than the first outer edge portion and the second outer edge portion of the four outer edge portions of the conductive sheet.

An electromagnetic shielding device according to a fourth aspect is one aspect of the electromagnetic shielding device according to the third aspect. In the electromagnetic shielding device according to the fourth aspect, the plurality of slits are formed such that the positions of the slits of a parallel slit group in the first direction are offset from those of another parallel slit group that is adjacent to the former parallel slit group in the second direction.

An electromagnetic shielding device according to a fifth aspect is one aspect of the electromagnetic shielding device according to any of the first to fourth aspects. In the electromagnetic shielding device according to the fifth aspect, the tube-shape holding member is a member that couples the first outer edge portion and the second outer edge portion of the conductive sheet to each other.

An electromagnetic shielding device according to a sixth aspect is one aspect of the electromagnetic shielding device according to any of the first to fifth aspects. The electromagnetic shielding device according to the sixth aspect further includes an anti-slip member that is formed of a metal member and that forms a projection protruding from a surface of the conductive sheet. The anti-slip member is joined to the surface of each of the third outer edge portion and the fourth outer edge portion of the four outer edge portions of the conductive sheet, the surface being located on an inner side of the conductive sheet when the conductive sheet is kept in a tube shape. The third outer edge portion and the fourth outer edge portion are outer edge portions other than the first outer edge portion and the second outer edge portion.

An electromagnetic shielding device according to a seventh aspect is one aspect of the electromagnetic shielding device according to any of the first to fourth aspects. In the electromagnetic shielding device according to the seventh aspect, the tube-shape holding member is configured by two bracket members that are formed of metal members. The two bracket members are joined to the conductive sheet in a state in which the two bracket members extend along the third outer edge portion and the fourth outer edge portion, respectively, of the four outer edge portions of the conductive sheet. Furthermore, each of the two bracket members has a ring shape as a result of its end portions being coupled to each other. The two bracket members keep the conductive sheet in a tube shape by keeping the third outer edge portion and the fourth outer edge portion, respectively, of the conductive sheet in ring shapes. The third outer edge portion and the fourth outer edge portion are outer edge portions other than the first outer edge portion and the second outer edge portion.

Moreover, the present invention may also be regarded as including a wire harness with an electrical wire and the electromagnetic shielding device according to any of the first to seventh aspects, the electromagnetic shielding device surrounding a periphery of the electrical wire.

Advantageous Effects

The electromagnetic shielding device according to the first aspect surrounds the periphery of an electrical wire by the flexible conductive sheet being kept in a tube shape in a state in which the two outer edge portions thereof are joined together. Thus, the electromagnetic shielding device according to the first aspect is not a member that is formed into a tube shape in advance, and therefore enables post-provision on an electrical wire and a support.

It is more preferable if the conductive sheet is flexible like, for example, a metallic cloth such that it can be deformed in accordance with the path of the electrical wire. In this case, the electromagnetic shielding device according to the first aspect can even cover the periphery of an electrical wire extending along a bent path, and thus provides a high degree of freedom in laying.

Incidentally, if a flexible conductive sheet is bent in a state in which it is kept in a tube shape, an inner portion of the bent portion is depressed toward the hollow portion, and the shape of the bent portion becomes flat. In this case, it is necessary to use a conductive sheet that is wider relative to the thickness of the electrical wire by a large margin. It should be noted that the width of the conductive sheet corresponds to the circumferential length of the tube-shaped conductive sheet surrounding the periphery of the electrical wire.

On the other hand, according to the second aspect, the conductive sheet that is kept in a tube shape can be bent at a portion where the parallel slit group is formed, without being largely deformed into a flat shape. That is to say, when the conductive sheet kept in a tube shape is laid along a bent path, portions between the plurality of slits in the inner portion of the bent portion of the conductive sheet are bent so as to protrude outward from the outer circumferential surface. Therefore, in the bent portion of the conductive sheet, deformation of the conductive sheet into a flat shape is suppressed.

Consequently, even in the case where the electromagnetic shielding device is laid along a bent path, the electrical wire can be electromagnetically shielded without necessitating an increase in the size of the conductive sheet.

Also, according to the third aspect, parallel slit groups are formed at a plurality of positions in the conductive sheet. Therefore, the conductive sheet kept in a tube shape can be bent at a plurality of positions without being largely deformed into a flat shape.

Also, in the electromagnetic shielding device according to the fourth aspect, the plurality of slits in the conductive sheet are formed such that the positions of the slits of a parallel slit group are offset from those of another parallel slit group that is adjacent to the former parallel slit group. Therefore, in the conductive sheet, the plurality of parallel slit groups can be formed in close proximity to one another while preventing the slits of a parallel slit group from being connected to the slits of another parallel slit group that is adjacent to the former parallel slit group. Accordingly, according to the fourth aspect, the conductive sheet kept in a tube shape can be bent at a plurality of positions that are in close proximity to one another, without being largely deformed into a flat shape. Consequently, the electromagnetic shielding device can even be laid along a path that is bent in a more complicated manner. Accordingly, the degree of freedom in the laying path is increased even more.

Also, in the electromagnetic shielding device according to the fourth aspect, the conductive sheet is kept in a tube shape by the two outer edge portions thereof being coupled to each other. In this case, the flexibility of the conductive sheet makes it possible to freely change the shapes of the openings at the respective end portions of a tube formed by the conductive sheet. Therefore, the electromagnetic shielding device according to the fourth aspect has excellent adaptability to the shapes of the supports over which the openings of the tube-shaped conductive sheet are to be placed.

Also, according to the fifth aspect, in the case where the openings of the tube-shaped conductive sheet are fixed to the supports with the crimp rings, due to the effect of the anti-slip members, the problem of the conductive sheet slipping off the supports is unlikely to occur.

Also, with the electromagnetic shielding device according to the sixth aspect, since the two bracket members are each kept in a ring shape, the conductive sheet whose outer edge portions are respectively joined to the two bracket members forms a tube shape surrounding the periphery of the electrical wire.

In the electromagnetic shielding device according to the sixth aspect, the two bracket members are fixed to the respective supports by being kept in ring shapes in a state in which the bracket members are in contact with the outer circumferential surfaces of the respective metal supports. Also, each bracket member relays the electrical connection between the conductive sheet and the corresponding casing, and the conductive sheet is electrically connected to the casings via the two bracket members. Thus, the conductive sheet is in a casing grounded state.

That is to say, according to the sixth aspect, the two bracket members have the function of keeping the conductive sheet in a tube shape and also the function of maintaining the electrical connection between the conductive sheet and the supports. Accordingly, when the electromagnetic shielding device according to the sixth aspect is employed, the number of man-hours required for management and handling of components is reduced as compared with the case where handling of a plurality of members is performed by using a conventional braided wire and a crimp ring.

Employing the wire harness provides effects similar to the effects that have been described above with respect to the electromagnetic shielding device according to the first aspect.

DETAILED DESCRIPTION OF THE EMBODIMENTS

Hereinafter, embodiments will be described with reference to the accompanying drawings. The embodiments described below are merely examples that embody the present invention, and are not to be construed as being cases that limit the technical scope of the present invention. An electromagnetic shielding device according to each of the embodiments described below is an electrical component that is attached to electrical wires of a wire harness installed in a vehicle and blocks electromagnetic noise with a conductive sheet surrounding the periphery of the electrical wires.

First Embodiment

First, the configurations of an electromagnetic shielding device 1 according to a first embodiment and a wire harness 100 according to the first embodiment will be described with reference to FIGS. 1 to 5.

Figure 1:
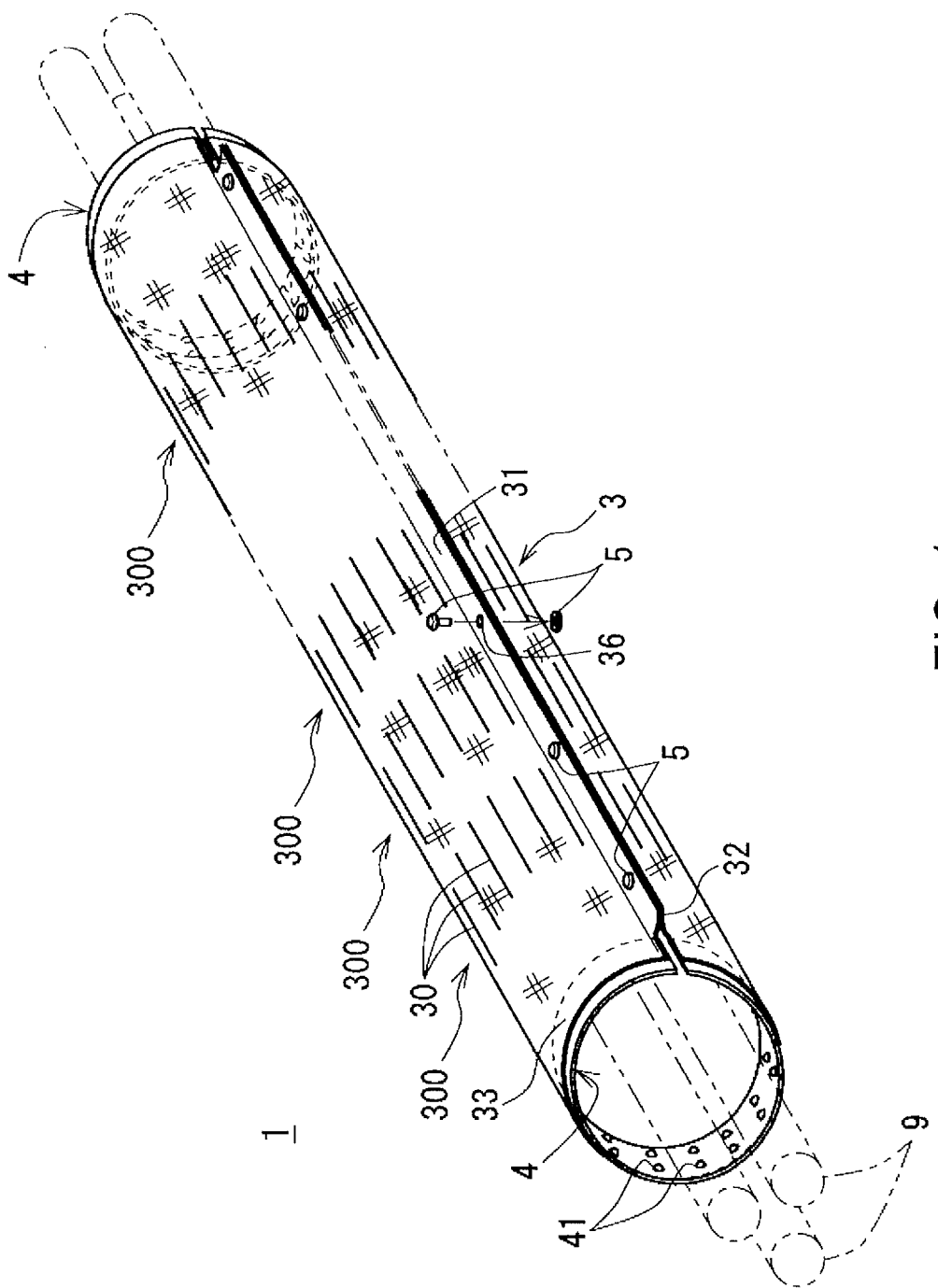
FIG. 1 is a perspective view of an electromagnetic shielding device 1 according to a first embodiment.

As shown in FIG. 1, the electromagnetic shielding device 1 is constituted by a conductive sheet 3 in which a plurality of slits 30 are formed, outer edge portion coupling members 5, and anti-slip members 4.

Figure 3:
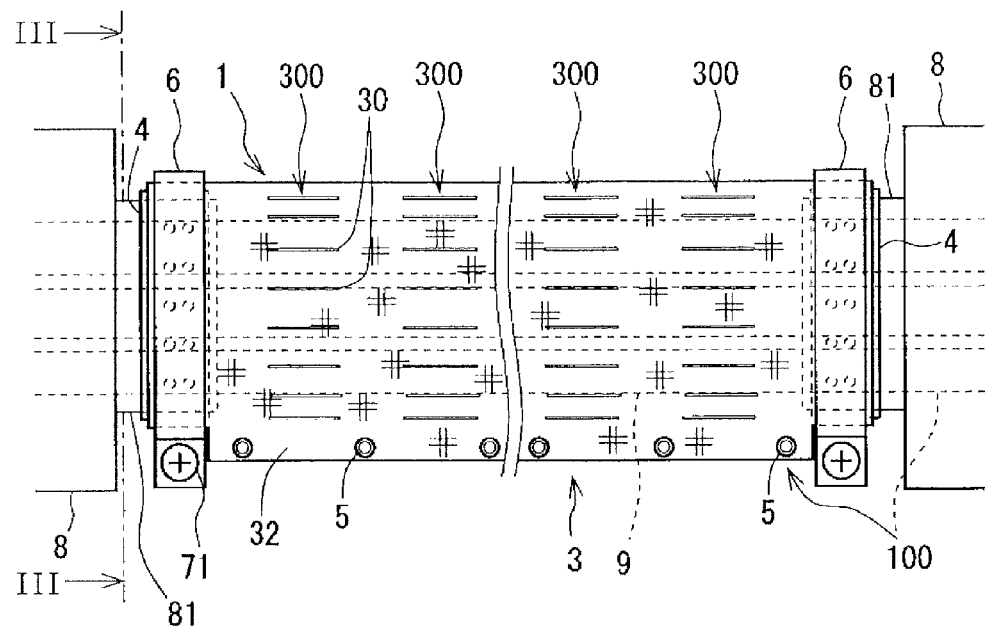
FIG. 3 is a plan view of a wire harness 100 according to the first embodiment and casings to which the wire harness 100 is attached.
Figure 4:
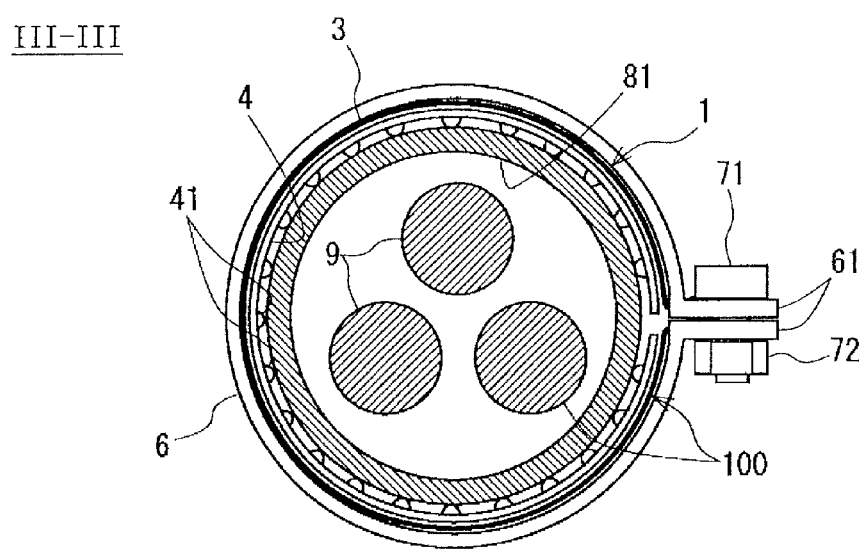
FIG. 4 is a cross-sectional view of the wire harness 100 attached to the casings.

Also, as shown in FIGS. 3 and 4, the wire harness 100 includes a plurality of electrical wires 9 and the electromagnetic shielding device 1 that surrounds the periphery of the plurality of electrical wires 9 collectively.

Electrical Wires

Figure 2:
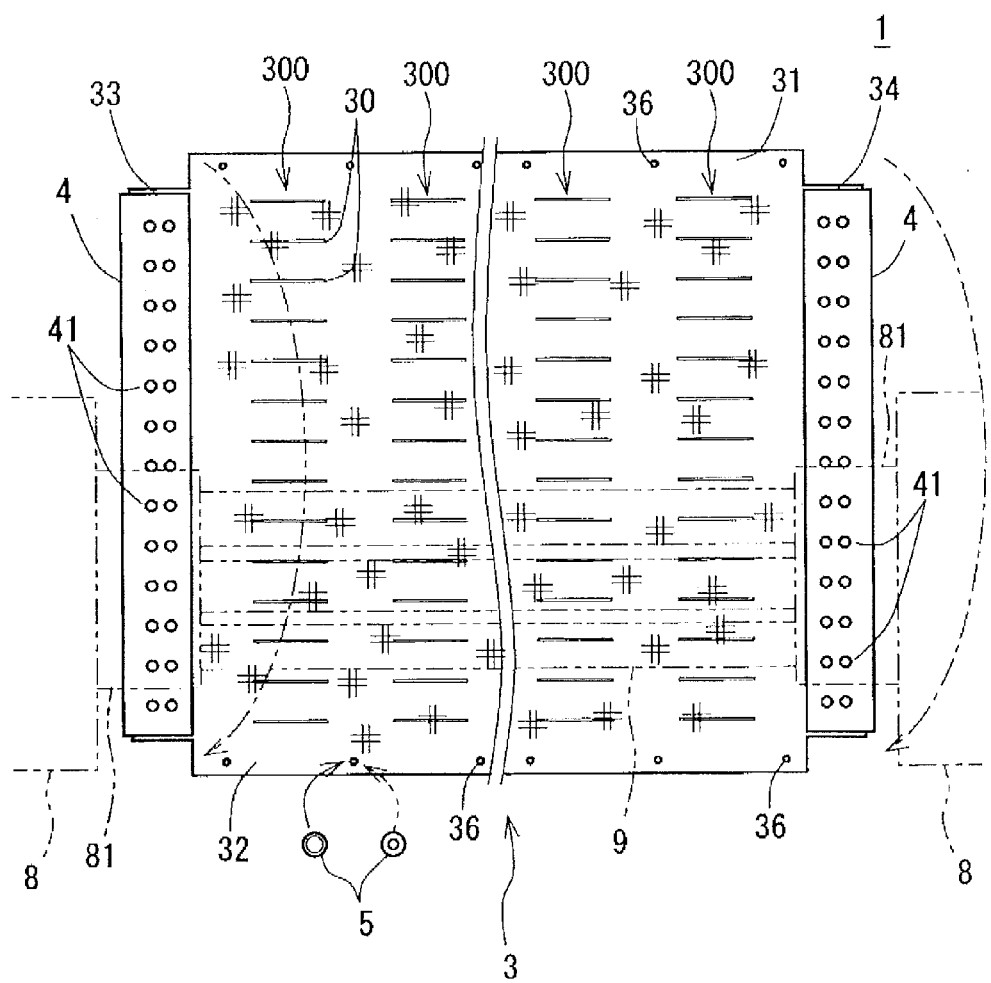
FIG. 2 is a plan view of the electromagnetic shielding device 1.

The electrical wires 9 are insulated electrical wires each composed of a core wire that is made of a conductive material and an insulating coating that is made of an insulating material and covers the periphery of the core wire. Usually, metal terminals, which are not shown, are connected to the core wires at end portions of the electrical wires 9. There are also cases where the wire harness 100 includes an electrical wire group holding member, which is not shown, the electrical wire group holding member keeping the end portions of the plurality of electrical wires 9 in a fixed positional relationship and being made of a resin material that electrically insulates the plurality of electrical wires 9 from one another. In FIGS. 1 and 2, the electrical wires 9 are drawn with phantom lines (long dashed double-short dashed lines).

Conductive Sheet

The conductive sheet 3 that constitutes the electromagnetic shielding device 1 is a sheet-shaped flexible conductive member that can be deformed into a tube shape. The conductive sheet 3 is, for example, a metallic cloth or a thin plate material made of a metal.

The metallic cloth is a metallic thread fabric. The metallic cloth is a material having a mesh structure obtained by weaving metallic threads containing, for example, copper as the main component so as to intersect each other vertically and horizontally. There are also cases where the metallic cloth has a structure in which a film is affixed to a material made of metallic threads. This film is made of a resin material and is flexible. The metallic cloth is conductive and flexible.

In a state in which the electromagnetic shielding device 1 is used, the conductive sheet 3 is kept in a tube shape surrounding the electrical wires 9. In the following description, the four outer edge portions of the conductive sheet 3 will be referred to as "first outer edge portion 31", "second outer edge portion 32", "third outer edge portion 33", and "fourth outer edge portion 34", respectively. Also, the direction from the first outer edge portion 31 toward the second outer edge portion 32 will be referred to as "first direction", and the direction from the third outer edge portion 33 toward the fourth outer edge portion 34 will be referred to as "second direction".

As shown in FIG. 1, in a state in which the electromagnetic shielding device 1 is used, the conductive sheet 3 is kept in a tube shape in a state in which the first outer edge portion 31 and the second outer edge portion 32 on the side opposite to the first outer edge portion 31 are joined together. The first outer edge portion 31 and the second outer edge portion 32 can also be considered as outer edge portions that constitute the two end portions of the conductive sheet 3 in a direction in which the conductive sheet 3 surrounds the periphery of the electrical wires 9. Also, in the conductive sheet 3, the first direction can also be said to be the direction in which the conductive sheet 3 surrounds the periphery of the electrical wires 9. In addition, in a state in which the conductive sheet 3 surrounds the periphery of the electrical wires 9, the second direction is the lengthwise direction of the electrical wires 9.

On the other hand, the third outer edge portion 33 is a portion that occupies a certain range extending inward from an outer edge, of the four outer edges of the conductive sheet 3 that forms one end in the lengthwise direction of the electrical wires 9 and is an attachment target. The fourth outer edge portion 34 is a portion that occupies a certain range extending inward from an outer edge of the conductive sheet 3 on the side opposite to the third outer edge portion 33.

A parallel slit group 300 is formed in the conductive sheet 3, the parallel slit group 300 being constituted by a plurality of slits 30 that extend in a direction that crosses the first direction and that are lined up in the first direction at a distance from one another. In the conductive sheet 3 according to this embodiment, a plurality of parallel slit groups 300 are formed such that the parallel slit groups 300 are arranged side by side at a distance from one another in the second direction.

In this embodiment, all of the plurality of slits 30 are formed into a straight line shape extending in the second direction. Accordingly, in each of the parallel slit groups 300, the plurality of slits 30 are formed such that the slits 30 are lined up in the direction (first direction) that is perpendicular to the direction (second direction) in which each of the slits 30 extends.

Moreover, in this embodiment, the plurality of slits 30 are formed such that the positions of the slits 30 of a parallel slit group 300 in the first direction are the same as those of another parallel slit group 300 that is adjacent to the former parallel slit group 300 in the second direction. For this reason, in order to avoid a situation in which adjacent slits 30 in the second direction are connected to each other, the plurality of parallel slit groups 300 are formed so as to be arranged side by side at a distance from one another in the second direction.

The slits 30 of the conductive sheet 3 are formed by, for example, Thomson die-cutting, punching, or the like. There are cases where the slits 30 are formed by punching, in which the conductive sheet 3 is sandwiched between a protruding die (punch) and a recessed die (die). In this case, burrs protruding in the punching direction, that is, toward the recessed die are likely to occur at the edges of the slits 30 in the conductive sheet 3. These burrs may damage the electrical wires 9. For this reason, in the case where the slits 30 are formed by punching, it is desirable that the conductive sheet 3 is deformed into a tube shape such that the surface of the conductive sheet 3 on the side on which the recessed die was situated during the processing for forming the slits 30 becomes the external surface.

Outer Edge Portion Coupling Member

The outer edge portion coupling members 5 are members that couple the first outer edge portion 31 and the second outer edge portion 32 of the conductive sheet 3 to each other. The first outer edge portion 31 and the second outer edge portion 32 of the conductive sheet 3 are coupled to each other by the outer edge portion coupling members 5. Thus, the conductive sheet 3 is kept in a tube shape in a state in which the first outer edge portion 31 and the second outer edge portion 32 are joined together. The outer edge portion coupling members 5 are an example of tube-shape holding members.

The outer edge portion coupling members 5 shown in FIGS. 1 and 3 are crimp fittings that couple the first outer edge portion 31 and the second outer edge portion 32 of the conductive sheet 3 to each other. The first outer edge portion 31 and the second outer edge portion 32 of the conductive sheet 3 are coupled to each other by a plurality of outer edge portion coupling members 5 at a plurality of positions. Moreover, as shown in FIG. 2, a plurality of through holes 36 into which a plurality of crimp fittings (outer edge portion coupling members 5) are inserted are formed in the first outer edge portion 31 and the second outer edge portion 32 of the conductive sheet 3.

Anti-Slip Member

The electromagnetic shielding device 1 includes two anti-slip members 4. The two anti-slip members 4 are metal members that are joined to the third outer edge portion 33 and the fourth outer edge portion 34, respectively, of the conductive sheet 3. The anti-slip members 4 are joined to the surface of the conductive sheet 3 that is located on the inner side when the conductive sheet 3 is kept in a tube shape. The anti-slip members 4 are joined to the conductive sheet 3 in a state in which electrical continuity is established between the conductive sheet 3 and the anti-slip members 4. For example, the anti-slip members 4 are joined to the conductive sheet 3 by welding.

A plurality of projections 41 are formed on internal surfaces of the anti-slip members 4 on the opposite side of external surfaces of the anti-slip members 4 that are joined to the conductive sheet 3. That is to say, the anti-slip members 4 are metal members that form projections protruding from the surface of the conductive sheet 3.

In this embodiment, the anti-slip members 4 are thin flexible metal plates that can be deformed into a tube shape. Moreover, the plurality of projections 41 are formed by embossing the thin metal plates. Therefore, a plurality of recesses respectively corresponding to the plurality of projections 41 are formed on the external surfaces of the thin plate-shaped anti-slip members 4.

Structure for Fixing Electromagnetic Shielding Device to Casing

Next, a structure for fixing the electromagnetic shielding device 1 to the casings 8 will be described with reference to FIGS. 1 to 4.

FIG. 3 is a plan view of the wire harness 100 in a state in which it is attached to the casings 8. FIG. 4 is a cross-sectional view of the wire harness 100 in the state in which it is attached to the casings 8. The cross-sectional view in FIG. 4 is a cross-sectional view taken along plane indicated in FIG. 3. In FIG. 2, the electrical wires 9 and the casings 8 are drawn with phantom lines (long dashed double-short dashed lines).

As shown in FIGS. 2 and 3, the electrical wires 9 of the wire harness 100 are routed from the outside of the metal casings 8 into the casings 8 through openings in the casings 8. A metal shield frame portion 81 is formed at an edge of the electrical wire introduction opening in each casing 8, the shield frame portion 81 surrounding the opening.

Also, as shown in FIGS. 3 and 4, one of the third outer edge portion 33 and the fourth outer edge portion of the conductive sheet 3 is fixed to the shield frame portion 81 of the casing 8 with a crimp ring 6, the casing 8 accommodating an apparatus to which one end portion of each of the electrical wires 9 is connected. Similarly, the other one of the third outer edge portion 33 and the fourth outer edge portion of the conductive sheet 3 is fixed to the shield frame portion 81 of the casing 8 with a crimp ring 6, the casing 8 accommodating another apparatus to which the other end portion of each of the electrical wires 9 is connected.

More specifically, before the outer edge portions of the conductive sheet 3 are coupled to each other, the third outer edge portion 33 and the fourth outer edge portion 34 of the conductive sheet 3 are respectively placed over the shield frame portions 81 of the two casings 8 with the anti-slip members 4 being located on the inner side. At this time, the thin plate-shaped anti-slip members 4 are bent along the outer circumferential surfaces of the shield frame portions 81. Thus, the entire conductive sheet 3 is deformed into a tube shape surrounding the periphery of the portion of the electrical wires 9 that extends between the two casings 8.

It should be noted that in the example shown in FIGS. 1 and 4, the conductive sheet 3 forms a cylindrical shape. However, the shapes of the third outer edge portion 33 and the fourth outer edge portion 34 of the conductive sheet 3 that is kept in a tube shape vary depending respectively on the shapes of the shield frame portions 81 of the casings 8 to which those outer edge portions are to be fixed.

Moreover, it is also conceivable that the targets over which the third outer edge portion 33 and the fourth outer edge portion 34 of the conductive sheet 3 are to be placed are other supports such as metal pipes for electrical wire protection through which the electrical wires 9 pass, instead of the shield frame portions 81 of the casings 8.

Next, the first outer edge portion 31 and the second outer edge portion 32 of the conductive sheet 3 are coupled to each other by the outer edge portion coupling members 5. In this embodiment, one of a pair of metal fittings constituting each of the crimp fittings is inserted into the through holes 36 that are formed in the first outer edge portion 31 and the second outer edge portion 32 of the conductive sheet 3. Furthermore, the pair of metal fittings are fastened to each other with a crimping tool in a state in which the first and second overlapping outer edge portions 31 and 32 are clamped therebetween. Thus, the conductive sheet 3 is kept in a tube shape in a state in which the first outer edge portion 31 and the second outer edge portion are joined together.

Furthermore, the third outer edge portion 33 and the fourth outer edge portion 34 of the conductive sheet 3 that are respectively placed over the shield frame portions 81 of the two casings 8 are fixed to the respective shield frame portions 81 with the crimp rings 6. The crimp rings 6 are metal members that each have a ring shape as a result of the two end portions thereof being joined together.

Each crimp ring 6 is kept in a ring shape by coupling portions 61 that are formed at the two end portions thereof being coupled to each other with a screw 71 and a nut member 72. The crimp rings 6 are kept in the ring shapes in a state in which the crimp rings 6 externally squeeze the third outer edge portion 33 and the fourth outer edge portion 34, respectively, of the conductive sheet 3 that are placed over the shield frame portions 81. Thus, the third outer edge portion 33 and the fourth outer edge portion 34 of the conductive sheet 3 are fixed to the shield frame portions 81 in a state in which these outer edge portions are each clamped between the crimp ring 6 and the shield frame portion 81.

Also, the anti-slip members 4 are clamped by the third outer edge portion 33 and the fourth outer edge portion 34, respectively, of the conductive sheet 3 and the corresponding shield frame portions 81. In this state, the plurality of projections 41 of the anti-slip members 4 are strongly pressed against the external surfaces of the shield frame portions 81. That is to say, the force with which each crimp ring 6 squeezes the corresponding shield frame portion 81 is concentrated at the vertex portions of the plurality of projections 41.

In a state in which the third outer edge portion 33 and the fourth outer edge portion 34 of the conductive sheet 3 are fixed respectively to the shield frame portions 81 of the two casings 8, the two anti-slip members 4 are electrically connected to the two casings 8, respectively. Therefore, the conductive sheet 3, which is conductive and is joined to the two anti-slip members 4, is also electrically connected to the two casings 8.

The conductive sheet 3 blocks electromagnetic noise directed toward the electrical wires 9 or generated from the electrical wires 9 by being electrically connected to the casings 8 while surrounding the periphery of the electrical wires 9.

Structure for Bending Conductive Sheet

Figure 5:
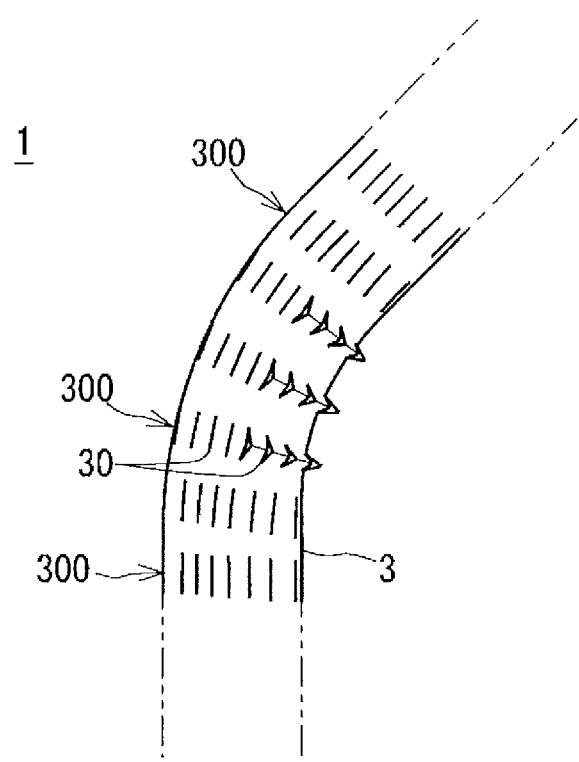
FIG. 5 is a plan view of a portion of a conductive sheet of the electromagnetic shielding device 1 that is laid along a bent path.

Next, a structure for bending the conductive sheet 3 will be described with reference to FIG. 5. FIG. 5 is a plan view of a portion of the conductive sheet 3 of the electromagnetic shielding device 1 that is laid along a bent path.

When a sheet-shaped member that is flexible like the conductive sheet 3 is bent in a state in which it is kept in a tube shape, an inner portion of the bent portion becomes depressed toward the hollow portion. Accordingly, the shape of the bent portion becomes flat. In this case, it is necessary to use a conductive sheet that is wider relative to the thickness of the electrical wires 9 by a large margin. It should be noted that the width of the conductive sheet corresponds to the circumferential length of the tube-shaped conductive sheet surrounding the periphery of the electrical wires 9.

On the other hand, with regard to the electromagnetic shielding device 1, the conductive sheet 3 kept in a tube shape can be bent at a portion where the parallel slit group 300 is formed, without being largely deformed into a flat shape.

That is to say, as shown in FIG. 5, there are cases where the conductive sheet 3 kept in a tube shape is laid along a bent path. In these cases, in the inner portion of the bent portion, portions between the plurality of slits 30 are bent so as to protrude outward from the outer circumferential surface. Therefore, at the bent portion of the conductive sheet 3, deformation of the conductive sheet 3 into a flat shape is suppressed.

Effects

The electromagnetic shielding device 1 surrounds the periphery of the electrical wires 9 by the flexible conductive sheet 3 being kept in a tube shape in a state in which the first outer edge portion 31 and the second outer edge portion 32 are joined together. Thus, the electromagnetic shielding device 1 is not a member that is formed into a tube shape in advance, and therefore enables post-provision on the electrical wires 9 and the shield frame portions 81 (supports).

More specifically, the electromagnetic shielding device 1 can be mounted on the electrical wires 9 after the connectors or the like are attached to the end portions the electrical wires 9. Furthermore, the electromagnetic shielding device 1 can also be mounted on the electrical wires 9 after the electrical wires 9 are routed from the outside of the casings 8 to the inside.

Also, in the electromagnetic shielding device 1, it is sufficient if a conductive sheet 3 having a size that is neither too large nor too small to surround the periphery of the electrical wires 9 is employed. For this reason, the electromagnetic shielding device 1 can be employed without increasing the layout space, weight, and manufacturing cost.

Also, if the conductive sheet 3 is flexible like a metallic cloth such that it can be freely deformed in accordance with the path of the electrical wires 9, the electromagnetic shielding device 1 can even cover the periphery of the electrical wires 9 that extend along a bent path. If this is the case, the electromagnetic shielding device 1 provides a high degree of freedom in laying.

In particular, as shown in FIG. 5, the conductive sheet 3 of the electromagnetic shielding device 1 can be bent at a portion where a parallel slit group 300 is formed, without being largely deformed into a flat shape. Therefore, at the bent portion of the conductive sheet 3, deformation of the conductive sheet 3 into a flat shape is suppressed. Consequently, even in the case where the electromagnetic shielding device 1 is laid along a bent path, the electrical wires 9 can be electromagnetically shielded without necessitating an increase in the size of the conductive sheet 3.

Also, in the electromagnetic shielding device 1, a plurality of parallel slit groups 300 are formed at a plurality of positions in the conductive sheet 3. Therefore, the conductive sheet 3 kept in a tube shape can be bent at the plurality of positions without being largely deformed into a flat shape. Consequently, the electromagnetic shielding device 1 can also be laid along a path that is bent at a plurality of positions. This increases the degree of freedom in the laying path even more.

Also, in the electromagnetic shielding device 1, the conductive sheet 3 is kept in a tube shape by the two outer edge portions being coupled to each other. In this case, the shapes of the openings at the end portions of a tube formed by the conductive sheet 3 can be freely changed because of the flexibility of the conductive sheet 3 and the anti-slip members 4. Therefore, the electromagnetic shielding device 1 has excellent adaptability to the shapes of the supports such as the shield frame portions 81 over which the openings of the tube-shaped conductive sheet 3 are respectively to be placed.

Incidentally, the surface of a metallic cloth has minute irregularities like the surface of a braided wire, the irregularities being formed by thin metal wires. Therefore, the frictional resistance of the surface of a metallic cloth is extremely small. If the conductive sheet 3 having a small frictional resistance like a metallic cloth is used, when the conductive sheet 3 is clamped and fixed between the shield frame portions 81 of the casings and other fixing members such as crimp fittings, the conductive sheet 3 is likely to slip off the shield frame portions 81.

On the other hand, in the electromagnetic shielding device 1, the conductive sheet 3 is joined to the anti-slip members 4 in advance by welding or the like. Furthermore, due to the effect of the plurality of projections 41 that are formed on the anti-slip members 4, the frictional resistance between the anti-slip members 4 and the shield frame portions 81 increases. Thus, occurrence of the problem of the electromagnetic shielding device 1 slipping off the shield frame portions 81 of the casings 8 can be suppressed.

It should be noted that although not shown in FIG. 4, it is desirable that projections for increasing the frictional resistance between the conductive sheet 3 and the crimp rings 6 are also formed on the internal surfaces of the crimp rings 6.

Second Embodiment

Next, an electromagnetic shielding device 1A and a wire harness 100A provided with the electromagnetic shielding device 1A according to a second embodiment will be described with reference to FIGS. 6 and 7. The electromagnetic shielding device 1A differs from the electromagnetic shielding device 1, which is shown in FIGS. 1 to 5, only in the positional relationship of the slits 30 among the plurality of parallel slit groups 300 of the conductive sheet 3.

Figure 6:
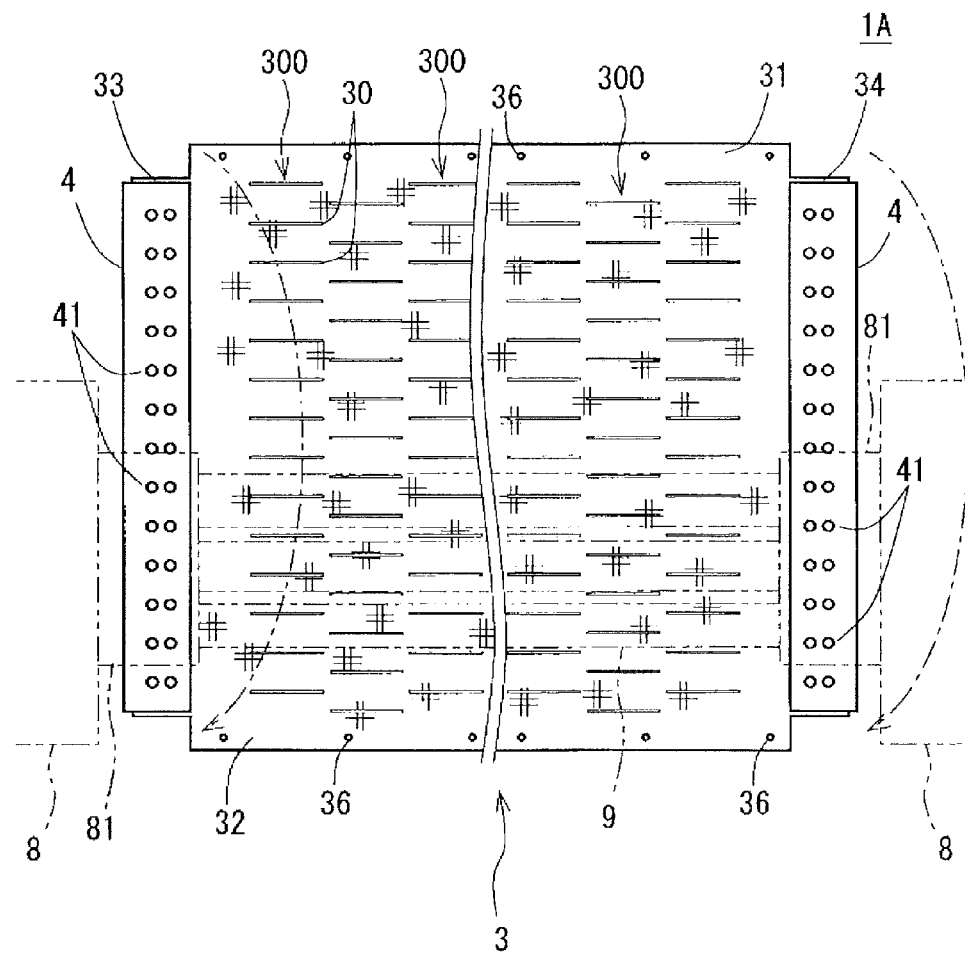
FIG. 6 is a plan view of an electromagnetic shielding device 1A according to a second embodiment.

FIG. 6 is a plan view of the electromagnetic shielding device 1A. FIG. 7 is a plan view of the wire harness 100A and the casings 8 to which the wire harness 100A is attached. In FIG. 6, the electrical wires 9 and the casings 8 are drawn with phantom lines (long dashed double-short dashed lines). Also, in FIGS. 6 and 7, constituent elements that are the same as those shown in FIGS. 1 to 5 are denoted by the same reference numerals. Hereinafter, only the differences of the electromagnetic shielding device 1A from the electromagnetic shielding device 1 will be described.

Figure 7:
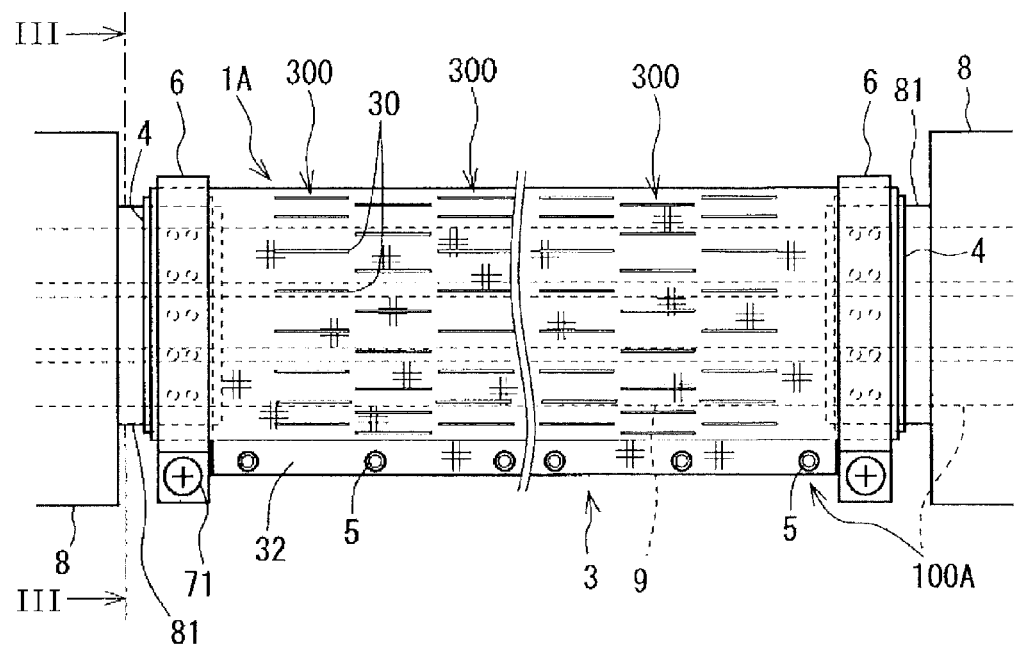
FIG. 7 is a plan view of a wire harness 100A according to the second embodiment and the casings to which the wire harness 100A is attached.

As shown in FIGS. 6 and 7, as in the case of the conductive sheet 3 of the electromagnetic shielding device 1, a plurality of parallel slit groups 300 are formed in the conductive sheet 3 of the electromagnetic shielding device 1A. However, in the electromagnetic shielding device 1A, the plurality of slits 30 of the conductive sheet 3 are formed such that the positions of the slits 30 of a parallel slit group 300 in the first direction are offset from those of another parallel slit group 300 that is adjacent to the former parallel slit group 300 in the second direction.

It should be noted that as described above, the first direction refers to the direction from the first outer edge portion 31 toward the second outer edge portion 32 of the conductive sheet 3, and the second direction refers to the direction from the third outer edge portion 33 toward the fourth outer edge portion 34 of the conductive sheet 3.

When the electromagnetic shielding device 1A is employed, effects that are similar to the effects that are achieved when the electromagnetic shielding device 1 is employed can be achieved. Furthermore, in the conductive sheet 3 of the electromagnetic shielding device 1A, it is possible to form the plurality of parallel slit groups 300 in close proximity to one another while preventing the slits 30 of a parallel slit group 300 from being connected to the slits 30 of another parallel slit group 300 that is adjacent to the former parallel slit group 300.

Accordingly, if the electromagnetic shielding device 1A is employed, the conductive sheet 3 kept in a tube shape can be bent at a plurality of portions that are in close proximity to one another, without being largely deformed into a flat shape. Consequently, the electromagnetic shielding device 1A can be laid along a path that is bent in a more complicated manner, and the degree of freedom in the laying path is increased even more.

Third Embodiment

Next, the configurations of an electromagnetic shielding device 1B according to a third embodiment and a wire harness 100B according to the third embodiment will be described with reference to FIGS. 8 to 12.

Figure 8:
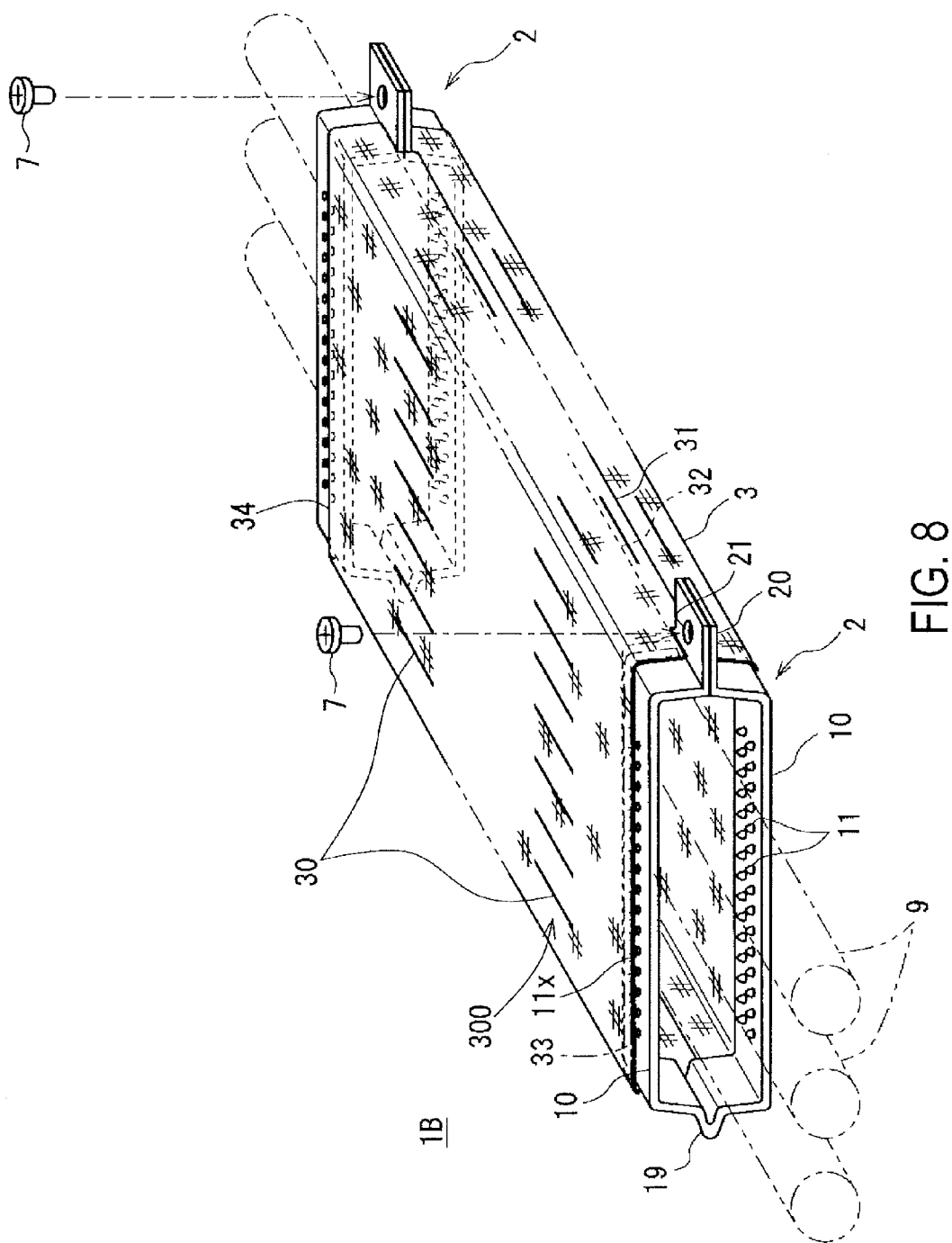
FIG. 8 is a perspective view of an electromagnetic shielding device 1B according to a third embodiment.
Figure 9:
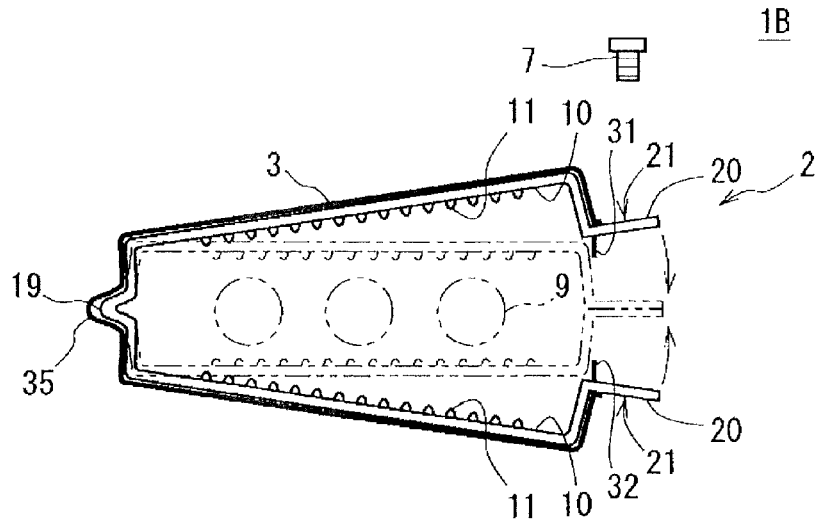
FIG. 9 is a front view of the electromagnetic shielding device 1B.
Figure 10:
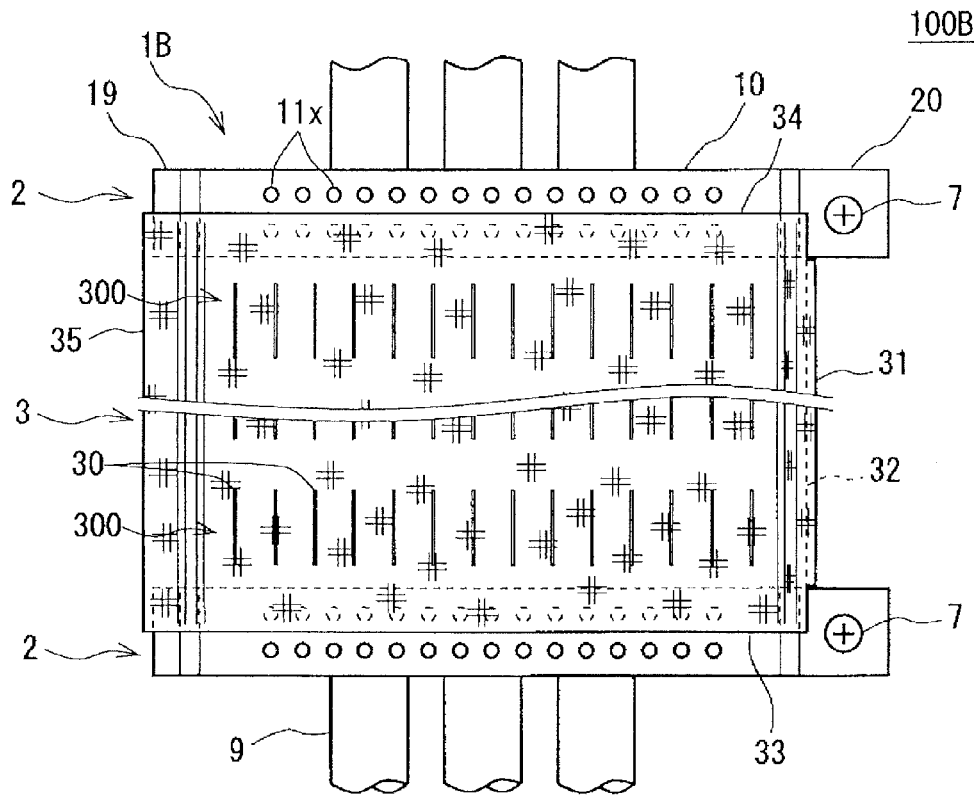
FIG. 10 is a plan view of a wire harness 100B according to the third embodiment.
Figure 11:
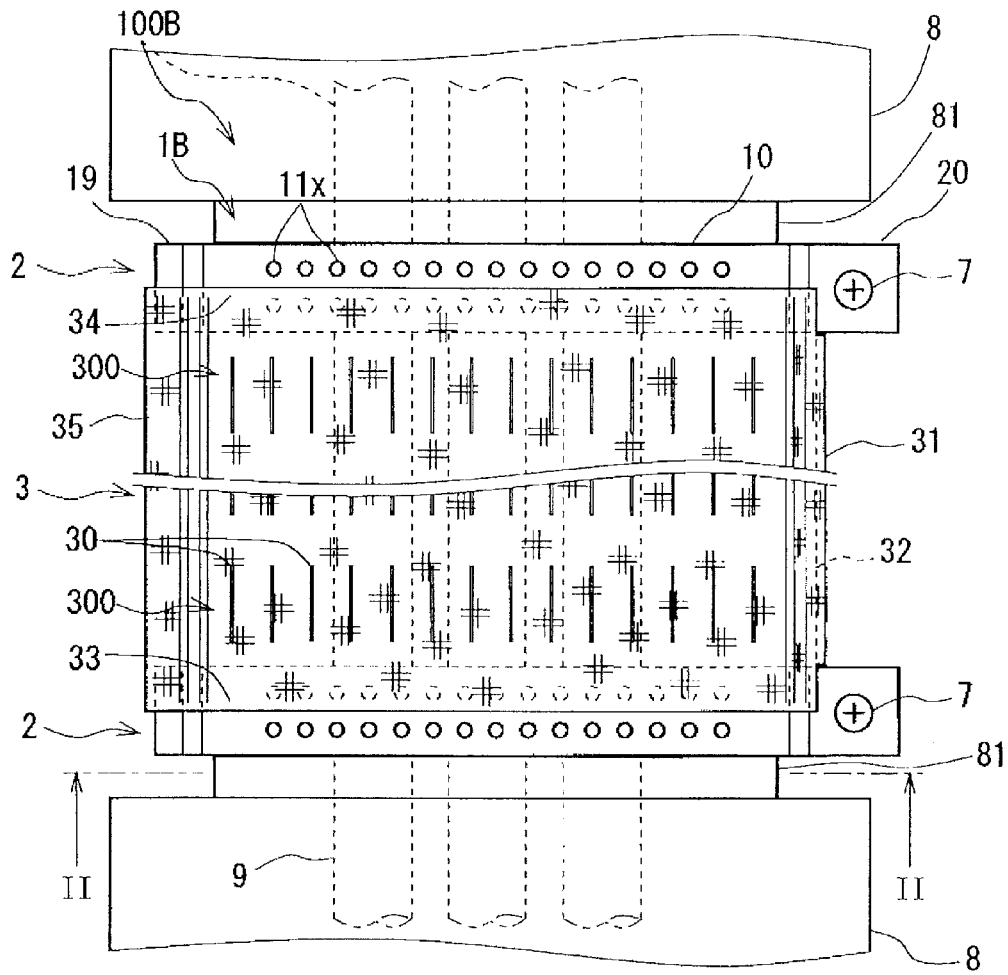
FIG. 11 is a plan view of the wire harness 100B in a state in which it is attached to the casings.
Figure 12:
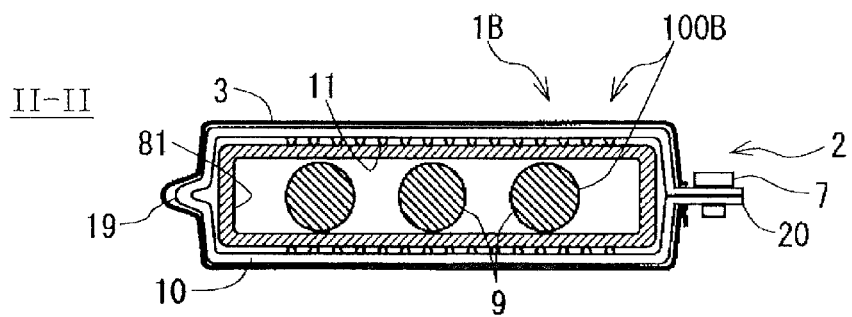
FIG. 12 is a cross-sectional view of the wire harness 100B in the state in which it is attached to the casings.

FIG. 8 is a perspective view of the electromagnetic shielding device 1B. FIG. 9 is a front view of the electromagnetic shielding device 1B. FIG. 10 is a plan view of the wire harness 100B. FIG. 11 is a plan view of the wire harness 100B in a state in which it is attached to the casings 8. FIG. 12 is a cross-sectional view of the wire harness 100B in the state in which it is attached to the casings 8. In FIGS. 8 and 9, the electrical wires 9 are drawn with phantom lines (long dashed double-short dashed lines). Also, the cross-sectional view in FIG. 12 is a cross-sectional view taken along plane II-II in FIG. 11.

In FIGS. 8 to 12, constituent elements that are the same as those shown in FIGS. 1 to 5 are denoted by the same reference numerals. Hereinafter, only the differences of the electromagnetic shielding device 1B from the electromagnetic shielding device 1 will be described.

As shown in FIG. 8, the electromagnetic shielding device 1B is constituted by two bracket members 2 and the conductive sheet 3 that is joined to the two bracket members 2. Also, as shown in FIG. 10, the wire harness 100B includes the plurality of electrical wires 9 and the electromagnetic shielding device 1B that covers the periphery of the plurality of electrical wires 9 collectively.

In the electromagnetic shielding device 1B, one of the two bracket members 2 is fixed to the shield frame portion 81 of the casing 8 that accommodates an apparatus to which one end portion of each of the electrical wires 9 is connected, and the other one of the two bracket members 2 is fixed to the shield frame portion 81 of the casing 8 that accommodates another apparatus to which the other end portion of each of the electrical wires 9 is connected. Each of the two bracket members 2 is fixed to the shield frame portion 81 of the corresponding metal casing 8 by end portions thereof being coupled to each other with a screw 7.

The electromagnetic shielding device 1B differs from the electromagnetic shielding device 1 shown in FIGS. 1 to 5 in the structure for keeping the conductive sheet 3 in a tube shape and the structure for fixing the third outer edge portion 33 and the fourth outer edge portion 34 of the conductive sheet 3 to the respective supports. Hereinafter, only the differences of the electromagnetic shielding device 1B from the electromagnetic shielding device 1 will be described.

Bracket Member

In the electromagnetic shielding device 1B, the bracket members 2 are bent plate-shaped members made of a conductive material. The bracket members 2 are made of a metal such as, for example, a copper alloy, iron, aluminum, or stainless steel, and a plating layer may be formed on the surfaces thereof, if necessary. The bracket members 2 are fixed to the respective shield frame portions 81 of the metal casings 8, and relay the electrical connection between the conductive sheet 3 and the casings 8.

As shown in FIGS. 8 and 9, each bracket member 2 is composed of two elongated portions 10, a connecting portion 19 that connects one end of each of the two elongated portions 10, and two cave portions 20 that are respectively connected to the other ends of the two elongated portions 10.

Bracket Member: Elongated Portion

Each of the two elongated portions 10 is a bent plate-shaped portion, and is formed in the shape of a half-ring that spans over the plurality of electrical wires 9 to be magnetically shielded. The two elongated portions 10 are combined with each other on two sides of the electrical wires 9, and thus form a ring shape surrounding the periphery of the electrical wires 9.

In the example shown in FIG. 8, an intermediate portion of each of the elongated portions 10 that extends across the electrical wires 9 is formed into a flat plate-like shape. However, the shapes of the elongated portions 10 may vary depending on the respective shapes of the shield frame portions 81 of the casings 8 to which the elongated portions 10 are to be fixed.

Also, the two elongated portions 10 are joined to the conductive sheet 3 in a state in which these portions are arranged in series along an outer edge portion of the conductive sheet 3. The conductive sheet 3 and the elongated portions 10 are joined by, for example, welding. The two elongated portions 10 of one of the two bracket members 2 are joined to the conductive sheet 3 in a state in which they are arranged in series along the third outer edge portion 33 of the conductive sheet 3. The two elongated portions 10 of the other one of the two bracket members 2 are joined to the conductive sheet 3 in a state in which they are arranged in series along the fourth outer edge portion 34 of the conductive sheet 3.

In this embodiment, the two elongated portions 10 are formed along a path that is turned back in the connecting portion 19, which will be described later. Therefore, the conductive sheet 3 that is joined to the two elongated portions 10 is kept, by the two elongated portions 10, in a state in which the conductive sheet 3 is turned back in an intermediate portion 35.

Also, in each of the two bracket members 2, external surfaces of the two elongated portions 10 are joined to the conductive sheet 3, the external surfaces being located on the side opposite to the side on which the two elongated portions 10 oppose each other. On the other hand, a plurality of projections 11 are formed on internal surfaces of the two elongated portions 10, the internal surfaces being located on the side on which the two elongated portions 10 oppose each other.

The plurality of projections 11 are formed by embossing. Therefore, a plurality of recesses 11× respectively corresponding to the plurality of projections 11 are formed on the external surfaces of the two elongated portions 10. In this embodiment, the two bracket members 2 double as the metal anti-slip members, which form the projections protruding from the surfaces of the third outer edge portion 33 and the fourth outer edge portion 34 of the conductive sheet 3.

Bracket Member: Connecting Portion

The connecting portion 19 is a turn-back plate-shaped portion, and is formed so as to be continuous with one end of each of the two elongated portions 10. That is to say, the two elongated portions 10 and the connecting portion 19 are composed of a single continuous member.

The connecting portion 19 is flexible in a direction in which the turn-back angle changes. As shown in FIG. 2, the flexibility of the connecting portion 19 enables the two elongated portions 10 to relatively pivot with the connecting portion 19 serving as the fulcrum. Thus, each bracket member 2 can be deformed to an open state in which the end portions of the respective elongated portions 10 are spaced apart from each other and the interior is freed, and to a closed state in which those end portions are in contact with each other.

In FIG. 9, the bracket member 2 in the open state is drawn with solid lines, and the bracket member 2 in the closed state is drawn with phantom lines (long dashed double-short dashed lines). When the two bracket members 2 are both put in the open state, the conductive sheet 3 joined to the two bracket members 2 is also put in an open state in which the first outer edge portion 31 and the second outer edge portion 32 are spaced apart from each other. When the two bracket members 2 are both put in the closed state, the conductive sheet 3 joined to the two bracket members 2 is kept in a tube shape in a state in which the first outer edge portion 31 and the second outer edge portion 32 are joined together.

That is to say, the two bracket members 2 are joined to the conductive sheet 3 in a state in which the bracket members 2 extend along the third outer edge portion 33 and the fourth outer edge portion 34, respectively, of the conductive sheet 3, and each of the two bracket members 2 has a ring shape as a result of the end portions thereof being coupled to each other. Then, the two bracket members 2 keep the conductive sheet 3 in a tube shape by keeping the third outer edge portion 33 and the fourth outer edge portion 34, respectively, of the conductive sheet 3 in ring shapes. It should be noted that the two bracket members 2 serve as an example of the tube-shape holding member.

The first outer edge portion 31 and the second outer edge portion 32 of the conductive sheet 3 are formed so as to extend slightly beyond the respective ends of the two elongated portions 10. Therefore, when the two bracket members 2 are both in the closed state, the first outer edge portion 31 and the second outer edge portion 32 of the conductive sheet 3 are in contact with each other with little or no gap therebetween. The conductive sheet 3 is thus deformed into a tube shape with little or no gap.

Bracket Member: Eave Portion

The two eave portions 20 are flat plate-shaped portions that are continuous with the other ends of the two elongated portions 10, respectively, and protrude laterally from the two elongated portions 10, respectively.

Accordingly, each bracket member 2 is a single continuous metal member in which the two elongated portions 10, the connecting portion 19, and the two eave portions 20 that are respectively continuous with the other ends of the two elongated portions 10 are formed. That is to say, the two elongated portions 10 are composed of a single continuous metal member together with the connecting portion 19, which connects the ends of the two elongated portions 10 to each other and is flexible, and the two eave portions 20, which are respectively continuous with the other ends of the two elongated portions 10.

In a state in which the two elongated portions 10 are combined with each other in a ring shape, the two eave portions 20 overlap each other. Also, a screw hole 21 in which the screw 7 is inserted is formed in each of the two eave portions 20. The screw holes 21 are through holes that communicate with each other in a state in which the two cave portions 20 overlap each other.

Each bracket member 2 has a ring shape as a result of the two cave portions 20 overlapping each other. The two overlapping eave portions 20 are kept in a combined state by the screw 7 being inserted therein. Thus, the end portions of the two elongated portions 10 are coupled to each other, so that the two elongated portions 10 are kept in a ring shape.

It is desirable that a screw thread that engages with the screw 7 is formed in an inner edge portion of the screw hole 21 in each of the two eave portions 20. With this configuration, the screw 7 can be directly fastened to the eave portions 20, and the need for the nut member for combining the two eave portions 20 together is eliminated.

It goes without saying that a fixing device for keeping the two elongated portions 10 in a ring shape may also be composed of the two eave portions 20 in which the through holes are formed, the screw 7, and the nut member to which the screw 7 is fastened. In this case, it is also conceivable that the nut member is secured by welding or the like to one of the two overlapping eave portions 20 in advance.

As described above, each of the two bracket members 2 includes the two elongated portions 10, the connecting portion 19 that connects one end of each of the two elongated portions 10, and the eave portions 20 located at respective end portions of the two elongated portions 10 and coupled to each other. The two bracket members 2 keep the third outer edge portion 33 and the fourth outer edge portion 34, respectively, of the four outer edge portions of the conductive sheet 3 in ring shapes surrounding the periphery of the electrical wires 9, the fourth outer edge portion 34 being located on the side opposite to the third outer edge portion 33.

Structure for Fixing Electromagnetic Shielding Device to Casing

Next, a structure for fixing the electromagnetic shielding device 1 to the casings 8 will be described with reference mainly to FIGS. 11 and 12.

As shown in FIGS. 11 and 12, one of the two bracket members 2 is fixed to the shield frame portion 81 of the casing 8 that accommodates an apparatus to which one end portion of each of the electrical wires 9 is connected, and the other one of the two bracket members 2 is fixed to the shield frame portion 81 of the casing 8 that accommodates another apparatus to which the other end portion of each of the electrical wires 9 is connected.

More specifically, first, the two bracket members 2 both in the open state are placed over the respective shield frame portions 81 of the two casings 8, and the conductive sheet 3 that is also in the open state (non-tube-shaped body) is placed over the portion of the electrical wires 9 that extends between the two casings 8.

Next, the two bracket members 2 are both put in the closed state on the outer side of the respective shield frame portions 81. Thus, the two elongated portions 10 of each of the two bracket members 2 clamp the shield frame portion 81 therebetween, and the conductive sheet 3 is deformed into a tube shape surrounding the periphery of the electrical wires 9. At this time, the plurality of projections 11 of the two elongated portions 10 are strongly pressed against the external surface of the shield frame portion 81. That is to say, the force with which the two elongated portions 10 clamp the shield frame portion 81 therebetween is concentrated at the vertex portions of the plurality of projections 11.

Finally, each of the two screws 7 is inserted into the screw holes 21 in the two overlapping eave portions 20 of each of the two bracket members 2, so that the two eave portions 20 are kept in an overlapping state by the screw 7. Thus, the two bracket members 2 are both kept in the closed state and fixed to the respective shield frame portions 81.

In a state in which the two bracket members 2 are fixed to the respective shield frame portions 81 of the two casings 8, the two bracket members 2 are electrically connected to the two casings 8, respectively. Therefore, the conductive sheet 3, which is conductive and is joined to the two bracket members 2, is also electrically connected to the two casings 8.

Since the conductive sheet 3 is electrically connected to the casings 8 in a state in which it surrounds the periphery of the electrical wires 9, the conductive sheet 3 blocks electromagnetic noise directed toward the electrical wires 9 or generated from the electrical wires 9.

Effects

When the electromagnetic shielding device 1B is employed, effects that are similar to the effects that are achieved when the electromagnetic shielding device 1 is employed are achieved. However, in the electromagnetic shielding device 1B, it is desirable that the two bracket members 2 are shaped into shapes that match the respective shapes of the supports such as the shield frame portions 81 of the casings 8 in advance.

Also, in the electromagnetic shielding device 1B, the two bracket members 2 have the function of keeping the conductive sheet 3 in a tube shape and also the function of maintaining the electrical connection between the conductive sheet 3 and the shield frame portions 81 of the casings 8. Accordingly, when the electromagnetic shielding device 1B is employed, the number of man-hours required for management and handling of components is reduced as compared with the case where handling of a plurality of members is performed by using a crimp fitting.

Also, in the electromagnetic shielding device 1B, the conductive sheet 3 is joined to the elongated portions 10 of the two bracket members 2 in advance. Therefore, the two bracket members 2 can be directly fixed to the shield frame portions 81 without interposing the conductive sheet 3 therebetween. Accordingly, the problem of the electromagnetic shielding device 1B detaching from the shield frame portions 81 of the casings 8 is unlikely to occur.

Also, in the electromagnetic shielding device 1B, due to the effect of the plurality of projections 11 that are formed on the internal surfaces of the elongated portions 10, the frictional resistance between the elongated portions 10 and the shield frame portions 81 is increased. Accordingly, the force with which the bracket members 2 are kept on the respective shield frame portions 81 increases. Consequently, occurrence of the problem of the electromagnetic shielding device 1B detaching from the shield frame portions 81 of the casings 8 can be suppressed even more.

Also, in the electromagnetic shielding device 1B, the two elongated portions 10 of each of the two bracket members 2 are composed of a single continuous member together with the connecting portion 19. Therefore, when the electromagnetic shielding device 1B is employed, the number of components is reduced as compared with the case where the two elongated portions 10 are separate members. Therefore, the number of man-hours required for attachment to the casings 8 can be reduced.

Also, in the electromagnetic shielding device 1B, the conductive sheet 3 is joined to the external surfaces of the elongated portions 10. Therefore, the conductive sheet 3 is not sandwiched between the elongated portions 10 and the shield frame portions 81 of the casings 8. Therefore, it is unnecessary to separately form portions of the elongated portions 10 that come into contact with the shield frame portions 81 and portions of the elongated portions 10 that are joined to the conductive sheet 3 in order to prevent the conductive sheet 3 from being sandwiched. Accordingly, the size of the elongated portions 10 (bracket members 2) can be reduced.

Fourth Embodiment

Figure 13:
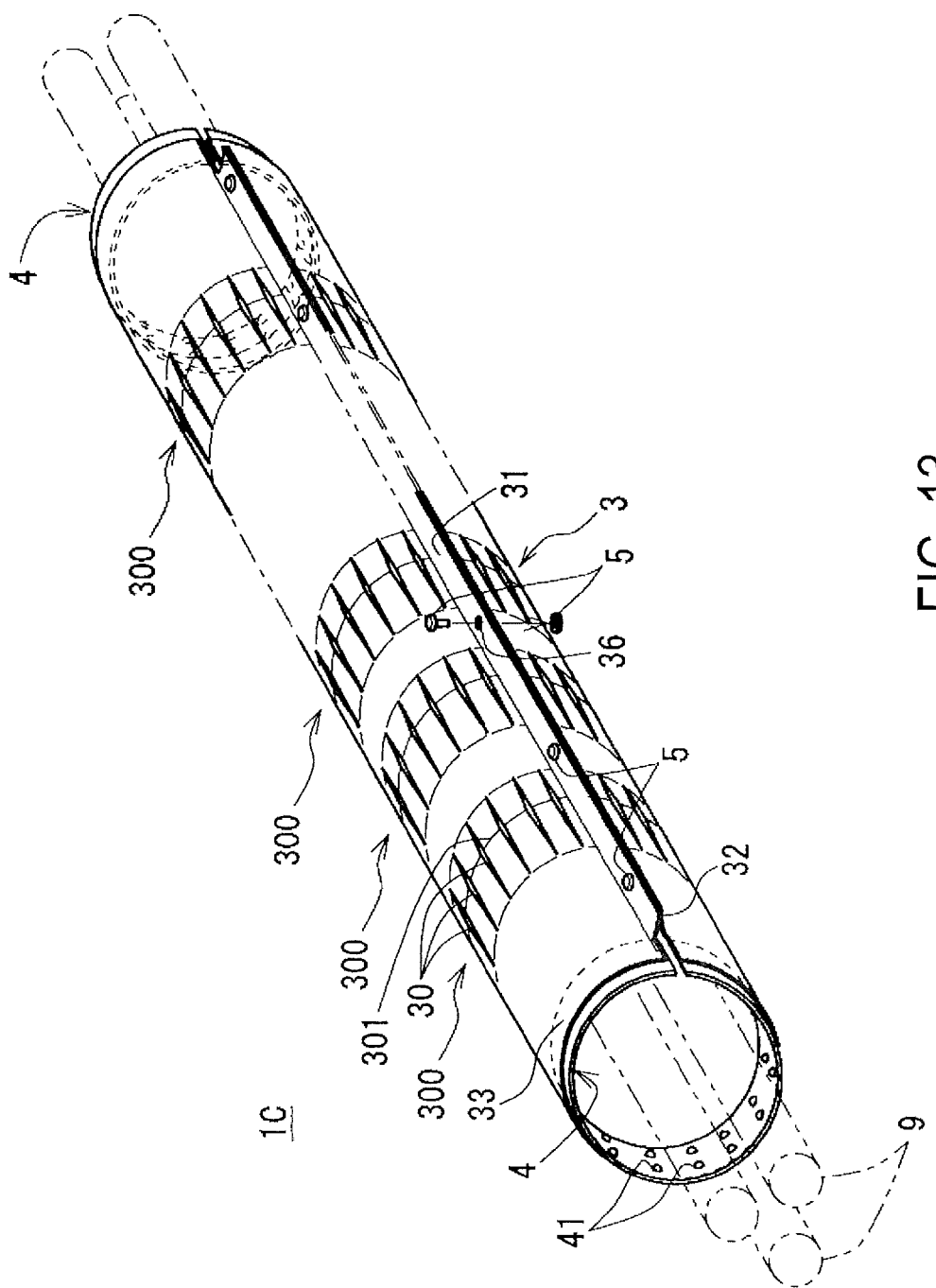
FIG. 13 is a perspective view of an electromagnetic shielding device 1C according to a fourth embodiment.

Next, an electromagnetic shielding device 1C according to a fourth embodiment will be described with reference to FIG. 13. This electromagnetic shielding device 1C differs from the electromagnetic shielding device 1 shown in FIGS. 1 to 5 in that a folding line 301 that extends across each parallel slit group 300 is formed on the conductive sheet 3 in advance. In FIG. 13, constituent elements that are the same as those shown in FIGS. 1 to 5 are denoted by the same reference numerals. Hereinafter, only the differences of the electromagnetic shielding device 1C from the electromagnetic shielding device 1 will be described.

As shown in FIG. 13, the folding lines 301 on the conductive sheet 3 constitute ridges that are formed as a result of the portions between the plurality of slits 30 of the individual parallel slit groups 300 rising from the external surface of the tube-shaped conductive sheet 3 and being bent. Furthermore, the folding lines 301 are formed so as to extend across the respective parallel slit groups 300. In this embodiment, the folding lines 301 on the conductive sheet 3 are formed so as to extend across the respective parallel slit groups 300 in the first direction.

As shown in FIG. 5, when the conductive sheet 3 is laid along a bent path, the portions between the plurality of slits 30 in the inner portion of the bent portion of the conductive sheet 3 are bent so as to protrude outward from the outer circumferential surface. In the electromagnetic shielding device 1C, the folding lines 301 on the conductive sheet 3 are formed in order to make the portions between the plurality of slits 30 be easily bent so as to protrude outward from the outer circumferential surface.

The employment of the electromagnetic shielding device 1C shown in FIG. 13 further facilitates the deformation of the conductive sheet 3 along a bent path.

Further Considerations

In the electromagnetic shielding devices 1, 1A, 1B, and 1C, all of the plurality of slits 30 of the conductive sheet 3 are formed into a straight line shape extending in the second direction. However, it is also conceivable that the plurality of slits 30 are formed so as to extend in a direction that is inclined with respect to the second direction.

It is also conceivable that the parallel slit group 300 in the conductive sheet 3 is formed at only one position in the conductive sheet 3 in the second direction. Also, in the electromagnetic shielding devices 1, 1A, and 1B, the parallel slit groups 300 are formed in a range over almost the entire conductive sheet 3 in the first direction.

However, there are cases where the bending direction of the conductive sheet 3 is limited to a single direction. In these cases, it is also conceivable that the parallel slit groups 300 are formed in only a range that occupies a portion of the conductive sheet 3 in the first direction. In this case, it is sufficient if the parallel slit groups 300 are formed in the inner portion of the bent portion of the tube-shaped conductive sheet 3.

Also, in the electromagnetic shielding devices 1, 1A, and 1C, the anti-slip members 4 may also be composed of a plurality of granular metal members that are joined to the surfaces of the third outer edge portion 33 and the fourth outer edge portion 34 of the conductive sheet 3 by welding or the like. Such granular metal members also form the projections protruding from the surfaces of the third outer edge portion 33 and the fourth outer edge portion 34 of the conductive sheet 3.

In the electromagnetic shielding device 1B, it is also conceivable that each of the two bracket members 2 is composed of two metal members that form a ring shape as a result of being combined with each other. For example, it is conceivable that each bracket member 2 is composed of two half-ring-shaped metal members. In this case, each half-ring-shaped metal member is composed of a single elongated portion 10 and two eave portions 20 respectively formed at the two ends of the elongated portion 10.

In the electromagnetic shielding devices 1, 1A, 1B, and 1C, it is also conceivable that a conductive sheet 3 in which not slits 30 are formed is employed. In this case, the conductive sheet 3 is flexible as well, and therefore the electromagnetic shielding device 1 can surround the periphery of the electrical wires 9 that extend along a bent path.

The invention claimed is:

1. An electromagnetic shielding device comprising:
   a conductive sheet that is a sheet-shaped flexible conductive member that can be deformed into a tube shape; and
   a tube-shape holding member that keeps the conductive sheet in a tube shape in a state in which a first outer edge portion and a second outer edge portion of four outer edge portions of the conductive sheet are joined together, the second outer edge portion being located on a side opposite to the first outer edge portion, wherein
   in the conductive sheet, a parallel slit group is formed, the parallel slit group being constituted by a plurality of slits that extend in a direction that crosses a first direction from the first outer edge portion toward the second outer edge portion and that are lined up in the first direction, and
   a folding line is formed, the folding line extending across the parallel slit group.

2. The electromagnetic shielding device according to claim 1,
   wherein a plurality of the parallel slit groups are formed in the conductive sheet such that the parallel slit groups are arranged side by side in a second direction from a third outer edge portion toward a fourth outer edge portion on a side opposite to the third outer edge portion, the third and fourth outer edge portions being edge portions other than the first outer edge portion and the second outer edge portion of the four outer edge portions of the conductive sheet.

3. The electromagnetic shielding device according to claim 2,
   wherein the plurality of slits are formed such that the positions of the slits of a parallel slit group in the first direction are offset from those of another parallel slit group that is adjacent to the former parallel slit group in the second direction.

4. The electromagnetic shielding device according to claim 2,
   wherein the tube-shape holding member is a member that couples the first outer edge portion and the second outer edge portion of the conductive sheet to each other.

5. The electromagnetic shielding device according to claim 2, further comprising:
   an anti-slip member that is formed of a metal member and joined to a surface of each of the third outer edge portion and the fourth outer edge portion of the four outer edge portions of the conductive sheet, the third and fourth outer edge portions being edge portions other than the first outer edge portion and the second outer edge portion, the surface being located on an inner side of the conductive sheet when the conductive sheet is kept in a tube shape, and the anti-slip member forming a projection protruding from the surface of the conductive sheet.

6. The electromagnetic shielding device according to claim 2,
wherein the tube-shape holding member is configured by two bracket members that are formed of metal members, joined to the conductive sheet in a state in which the two bracket members extend along the third outer edge portion and the fourth outer edge portion, respectively, which are edge portions other than the first outer edge portion and the second outer edge portion of the four outer edge portions of the conductive sheet, and each two bracket member having a ring shape as a result of end portions thereof being coupled to each other,
the two bracket members keeping the conductive sheet in a tube shape by keeping the third outer edge portion and the fourth outer edge portion, respectively, of the conductive sheet in ring shapes.

7. The electromagnetic shielding device according to claim 3,
wherein the tube-shape holding member is a member that couples the first outer edge portion and the second outer edge portion of the conductive sheet to each other.

8. The electromagnetic shielding device according to claim 3, further comprising:
an anti-slip member that is formed of a metal member and joined to a surface of each of the third outer edge portion and the fourth outer edge portion of the four outer edge portions of the conductive sheet, the third and fourth outer edge portions being edge portions other than the first outer edge portion and the second outer edge portion, the surface being located on an inner side of the conductive sheet when the conductive sheet is kept in a tube shape, and the anti-slip member forming a projection protruding from the surface of the conductive sheet.

9. The electromagnetic shielding device according to claim 3,
wherein the tube-shape holding member is configured by two bracket members that are formed of metal members, joined to the conductive sheet in a state in which the two bracket members extend along the third outer edge portion and the fourth outer edge portion, respectively, which are edge portions other than the first outer edge portion and the second outer edge portion of the four outer edge portions of the conductive sheet, and each two bracket member having a ring shape as a result of end portions thereof being coupled to each other,
the two bracket members keeping the conductive sheet in a tube shape by keeping the third outer edge portion and the fourth outer edge portion, respectively, of the conductive sheet in ring shapes.

10. The electromagnetic shielding device according to claim 1,
wherein the tube-shape holding member is a member that couples the first outer edge portion and the second outer edge portion of the conductive sheet to each other.

11. The electromagnetic shielding device according to claim 10, further comprising:
an anti-slip member that is formed of a metal member and joined to a surface of each of the third outer edge portion and the fourth outer edge portion of the four outer edge portions of the conductive sheet, the third and fourth outer edge portions being edge portions other than the first outer edge portion and the second outer edge portion, the surface being located on an inner side of the conductive sheet when the conductive sheet is kept in a tube shape, and the anti-slip member forming a projection protruding from the surface of the conductive sheet.

12. The electromagnetic shielding device according to claim 1, further comprising:
an anti-slip member that is formed of a metal member and joined to a surface of each of the third outer edge portion and the fourth outer edge portion of the four outer edge portions of the conductive sheet, the third and fourth outer edge portions being edge portions other than the first outer edge portion and the second outer edge portion, the surface being located on an inner side of the conductive sheet when the conductive sheet is kept in a tube shape, and the anti-slip member forming a projection protruding from the surface of the conductive sheet.

13. The electromagnetic shielding device according to claim 1,
wherein the tube-shape holding member is configured by two bracket members that are formed of metal members, joined to the conductive sheets in a state in which the two bracket members extend along the third outer edge portion and the fourth outer edge portion, respectively, which are edge portions other than the first outer edge portion and the second outer edge portion of the four outer edge portions of the conductive sheet, and each two bracket member having a ring shape as a result of end portions thereof being coupled to each other,
the two bracket members keeping the conductive sheet in a tube shape by keeping the third outer edge portion and the fourth outer edge portion, respectively, of the conductive sheet in ring shapes.

14. A wire harness comprising:
an electrical wire; and
an electromagnetic shielding device surrounding a periphery of the electrical wire,
wherein the electromagnetic shielding device includes:
a conductive sheet that is a sheet-shaped flexible conductive member that can be deformed into a tube shape; and
a tube-shape holding member that keeps the conductive sheets in a tube shape in a state in which a first outer edge portion and a second outer edge portion of four outer edge portions of the conductive sheet are joined together, the second outer edge portion being located on a side opposite to the first outer edge portion,
wherein in the conductive sheet, a parallel slit group is formed, the parallel slit group being constituted by a plurality of slits that extend in a direction that crosses a first direction from the first outer edge portion toward the second outer edge portion and that are lined up in the first direction, and furthermore, a folding line is formed, the folding line extending across the parallel slit group.

* * * * *